(12) United States Patent
Yamazaki et al.

(10) Patent No.: US 7,094,684 B2
(45) Date of Patent: Aug. 22, 2006

(54) MANUFACTURING METHOD OF SEMICONDUCTOR DEVICE

(75) Inventors: Shunpei Yamazaki, Setagaya (JP); Mitsuaki Osame, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 178 days.

(21) Appl. No.: 10/659,585

(22) Filed: Sep. 11, 2003

(65) Prior Publication Data

US 2004/0058527 A1    Mar. 25, 2004

(30) Foreign Application Priority Data

Sep. 20, 2002  (JP)  ............... 2002-276379

(51) Int. Cl.
    *H01L 21/4763*  (2006.01)
    *H01L 21/00*    (2006.01)
    *H01L 21/84*    (2006.01)

(52) U.S. Cl. ...................... 438/625; 438/151
(58) Field of Classification Search ............... 438/625, 438/592, 163, 149, 151, 157
See application file for complete search history.

(56) References Cited

U.S. PATENT DOCUMENTS

| | | | |
|---|---|---|---|
| 4,033,833 A | | 7/1977 | Bestel et al. |
| 4,659,650 A | * | 4/1987 | Moritz et al. ............... 430/313 |
| 5,100,499 A | * | 3/1992 | Douglas ..................... 216/66 |
| 5,693,563 A | * | 12/1997 | Teong ........................ 438/627 |
| 5,726,461 A | | 3/1998 | Shimada et al. |
| 5,851,918 A | | 12/1998 | Song et al. |
| 5,889,291 A | | 3/1999 | Koyama et al. |
| 5,929,948 A | | 7/1999 | Ohori et al. |
| 6,015,724 A | | 1/2000 | Yamazaki |
| 6,031,290 A | | 2/2000 | Miyazaki et al. |
| 6,265,247 B1 | * | 7/2001 | Nakanishi et al. ........... 438/149 |

(Continued)

FOREIGN PATENT DOCUMENTS

EP    0 989 614    3/2000

(Continued)

OTHER PUBLICATIONS

M.A. Baldo et al., "Very High-Efficiency Green Organic Light-Emitting Devices Based on Electrophorescence," Applied Physics Letters, vol. 75, No. 1, Jul. 5, 1999, pp. 4-6.

(Continued)

*Primary Examiner*—Carl Whitehead, Jr.
*Assistant Examiner*—Heather Doty
(74) *Attorney, Agent, or Firm*—Eric J. Robinson; Robinson Intellectual Property Law Office, P.C.

(57) ABSTRACT

It is an object of the present invention to suppress an influence of voltage drop due to wiring resistance to make an image quality of a display device uniform. In addition, it is also an object of the present invention to suppress delay due to a wiring for electrically connecting a driving circuit portion to an input/output terminal to improve an operation speed in the driving circuit portion.

In the present invention, a wiring including copper for realizing lowered wiring resistance, subjected to microfabrication, is used as a wiring used for a semiconductor device and a barrier conductive film for preventing diffusion of copper is provided for a TFT as a part of the wiring including copper to form the wiring including copper without diffusion of copper into a semiconductor layer of the TFT. The wiring including copper is a wiring including a laminate film of at least a conductive film containing copper as its main component, subjected to microfabricaiton, and the barrier conductive film.

40 Claims, 9 Drawing Sheets

U.S. PATENT DOCUMENTS

| | | |
|---|---|---|
| 6,359,320 B1 | 3/2002 | Yamazaki et al. |
| 6,413,845 B1 | 7/2002 | Izumi et al. |
| 6,475,912 B1 | 11/2002 | Harada |
| 6,479,900 B1 | 11/2002 | Shinogi |
| 6,498,091 B1 | 12/2002 | Chen et al. |
| 6,509,616 B1 | 1/2003 | Yamazaki |
| 6,509,649 B1 | 1/2003 | Sugai |
| 6,515,365 B1 | 2/2003 | Higashi et al. |
| 6,573,602 B1 | 6/2003 | Seo et al. |
| 6,890,849 B1 | 5/2005 | Kado et al. |
| 6,905,907 B1 | 6/2005 | Konuma |
| 2001/0010370 A1 | 8/2001 | Kimura et al. |
| 2001/0015618 A1 | 8/2001 | Yamazaki et al. |
| 2001/0030322 A1 | 10/2001 | Yamazaki et al. |
| 2002/0009818 A1 | 1/2002 | Yoshimoto |
| 2002/0044124 A1 | 4/2002 | Yamazaki et al. |
| 2002/0063287 A1 | 5/2002 | Yamazaki et al. |
| 2002/0070382 A1 | 6/2002 | Yamazaki et al. |
| 2002/0079503 A1 | 6/2002 | Yamazaki et al. |
| 2003/0090002 A1 | 5/2003 | Sugawara et al. |
| 2003/0127649 A1 | 7/2003 | Chae |
| 2004/0056855 A1 | 3/2004 | Yamazaki et al. |
| 2005/0014359 A1 | 1/2005 | Segawa et al. |
| 2005/0020061 A1 | 1/2005 | Fang et al. |

FOREIGN PATENT DOCUMENTS

| | | |
|---|---|---|
| EP | 1 063 693 | 12/2000 |
| JP | 57-126967 | 8/1982 |
| JP | 61-235560 | 10/1986 |
| JP | 05-066421 | 3/1993 |
| JP | 06-148685 | 5/1994 |
| JP | 07-235680 | 9/1995 |
| JP | 08-274336 | 10/1996 |
| JP | 10-090711 | 4/1998 |
| JP | 11-016912 | 1/1999 |
| JP | 2000-058650 | 2/2000 |
| JP | 2000-357671 | 12/2000 |
| JP | 2001-196371 | 7/2001 |
| JP | 2001-236025 | 8/2001 |
| JP | 2001-254169 | 9/2001 |
| JP | 2001-313397 | 11/2001 |
| JP | 2002-108243 | 4/2002 |
| JP | 2002-353167 | 12/2002 |
| WO | WO 00/36641 | 6/2000 |

OTHER PUBLICATIONS

Tsutsui et al., High Quantam Efficiency in Organic Light-Emitting Devices with Iridium-Complex as a Triplet Emissive Center, Japanese Journal of Applied Physics, vol. 38, Part 12B, Dec. 15, 1999, pp. L1502-L1504, abstract only.

M.A. Baldo et al., "Highly Efficient Phosphorescent Emission from Organic Electroluminescent Devices," Nature, vol. 395, Sep. 10, 1998, pp. 151-154.

Stanley Wolf"4.5.6.3 Contact-Hole and Via Filling with Selective Electroless Metal Deposition," Silicon Processing for the VLSI Era, vol. 2, Process Integration, pp. 256-257.

M. Hatano et al., "A Novel Self-Aligned Gate-Overlapped LDD Poly-Si TFT with High Reliability and Performance," IEDM 97, pp. 523-526.

U.S. Appl. No. 10/245,701 entitled Semiconductor Device and Method of Manufacturing the Same filed Sep. 18, 2002.

International Search Report dated Dec. 24, 2003.

Written Opinion for PCT/JP2003/11977 dated May 25, 2004.

Official Action dated Nov. 15, 2005 for U.S. Appl. No. 10/664,962, filed Sep. 22, 2003 to Yamazaki.

Tsutsui et al., High Quantum Efficiency in Organic Light-Emitting Devices with Iridium-Complex as a Triplet Emissive Center, Japanese Journal of Applied Physics, vol. 38, Part 12B, Dec. 15, 1999, pp. L1502-L1504.

* cited by examiner

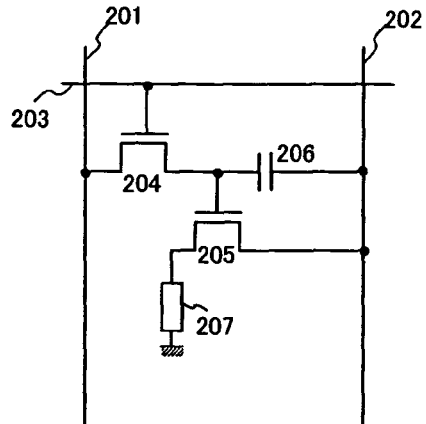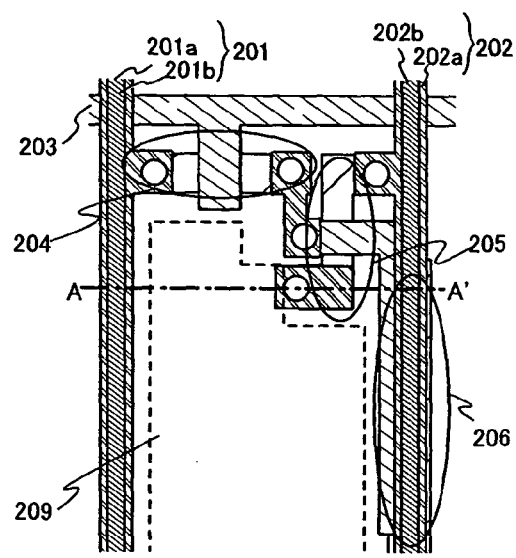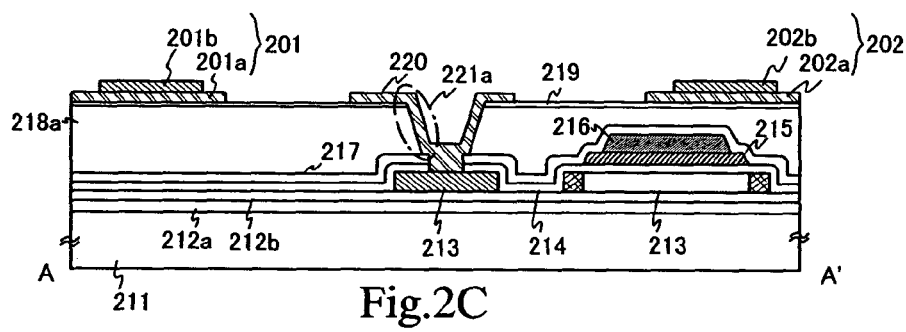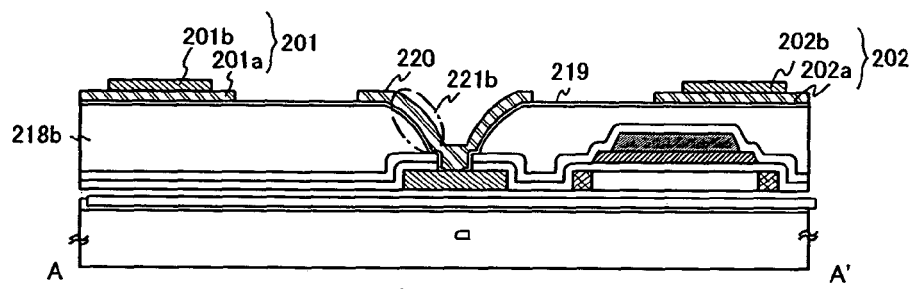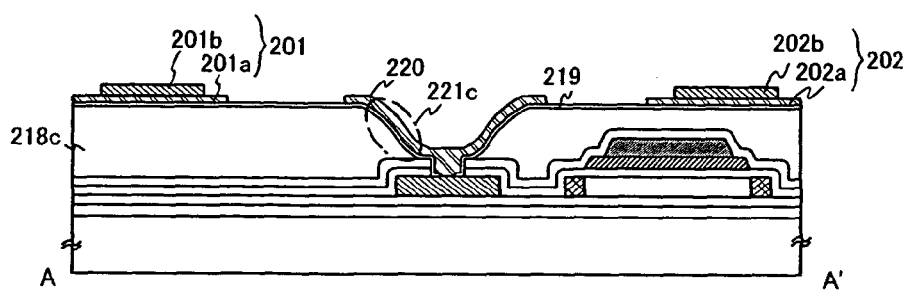

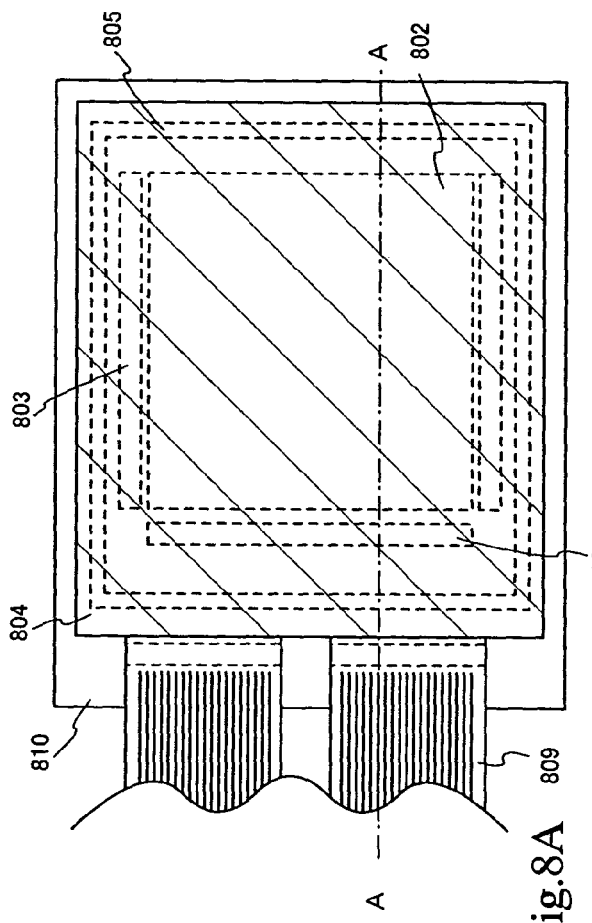
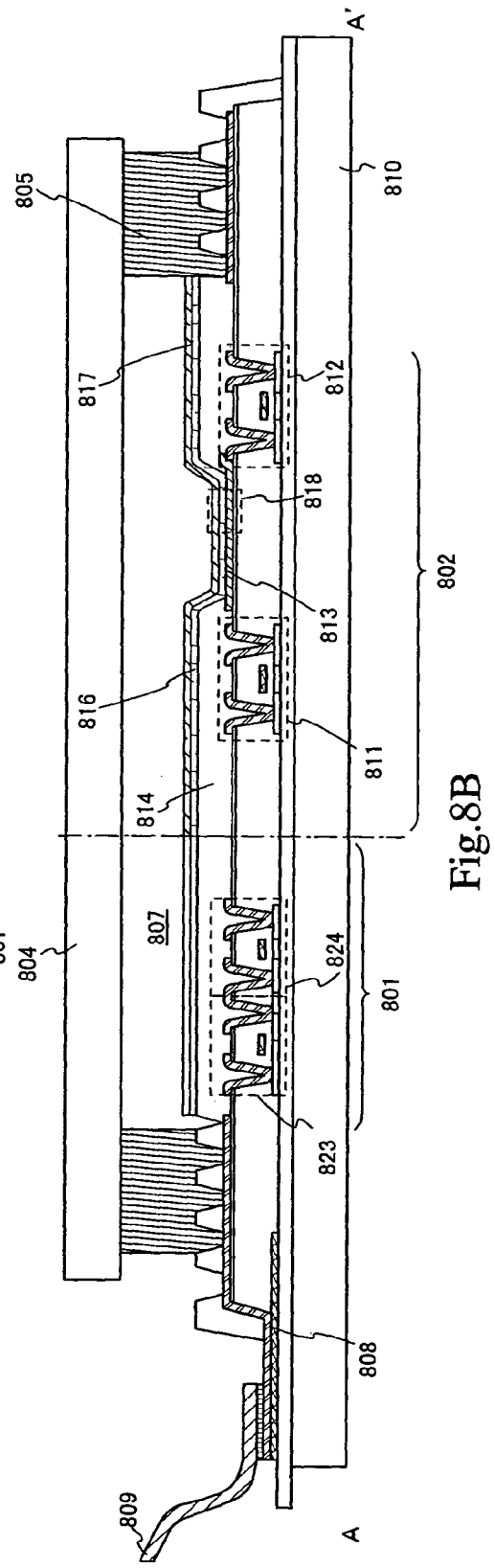
Fig.8A
Fig.8B

MANUFACTURING METHOD OF SEMICONDUCTOR DEVICE

BACKGROUND OF THE INVENTION

1. Field of the Invention

The present invention relates to wiring formation in the field of a semiconductor device that has a semiconductor element (typically, a transistor) used as a device, and belongs to technical fields on lowering resistance of a wiring and miniaturization thereof.

2. Description of the Related Art

There have recently been developed techniques of manufacturing a TFT with using a thin semiconductor film (a thickness on the order of several hundreds to several thousands nm) formed on an insulating surface. The TFT is widely applied to an integrated circuit (IC) and a semiconductor device such as an electro-optical device, and has been rapidly developed particularly as a switching element of display devices including a liquid crystal display device and a light emitting device.

Above all, the application of display devices such as a monitor and a television has been expanded and mass production of the display devices has proceeded. Therefore, it is required additionally to achieve a large-sized screen, a high definition, a high open area ratio, and a high reliability.

There is, however, voltage drop (also referred to as IR drop) due to a wiring resistance as a phenomenon that becomes a problem in driving a display device, which is a phenomenon that a voltage is more lowered as a distance from a power source is larger in the same wiring. This problem is especially serious in the case of a long wiring length, and is a barrier against the achievement of a large screen of the display device.

Namely, the voltage drop due to the wiring resistance makes it impossible to transmit a desired voltage, which causes as the result a trouble that uniformity of an image quality is significantly damaged in a pixel portion. A contrivance such as applying voltage from both ends of a wiring is attempted to improve such problem. However, the influence of the voltage drop cannot be neglected after all since the wiring is taken around long.

In the case of fabricating a monolithic display device in which a driving circuit portion (typically including a gate driving circuit and a source driving circuit) is formed integrally on the same substrate, a wiring resistance of a wiring taken around between the driving circuit portion and an input terminal for an electric signal becomes a problem. The wiring resistance is likely to cause delay in the electric signal to lower an operation speed of the gate driving circuit or the source driving circuit.

As set forth above, there are troubles that uniformity of an image quality is significantly damaged and an operation speed of the driving circuit portion is extremely lowered by the voltage drop due to the wiring resistance and the delay in the electric signal. Such problem is especially serious in the case of a display device that has a large-sized screen with diagonally several tens inch.

For the above-mentioned problem, it is reported that a material with low resistance is used to lower a wiring resistance (for example, Japanese Patent Laid-Open 2000-58650). In such case, however, microfabrication is difficult and particle contamination is caused in using CMP since copper is used as the material with low resistance and a copper wiring is formed with damascene.

In addition, there is the known technique that a substrate that has an element formed and a printed wiring board (PWB) with a large hardness are electrically connected with a conductor (an isotropic conductive film or bump) to reduce resistance of various wirings (first group of wirings) formed on the substrate that has the element formed in order to suppress an influence of voltage drop due to wiring resistance (for example, Japanese Patent Laid-Open 2001-236025).

SUMMARY OF THE INVENTION

It is an object of the present invention to suppress the above-mentioned influence of the voltage drop due to wiring resistance to make an image quality of a display device uniform. In addition, it is also an object of the present invention to suppress delay due to a wiring for electrically connecting a driving circuit portion to an input/output terminal to improve an operation speed in the driving circuit portion.

In order to achieve the objects mentioned above, the present invention has a feature that a wiring including copper for realizing lowered wiring resistance, subjected to microfabrication is used as a wiring used for a semiconductor device and a conductive film (Hereinafter, a barrier conductive film) for preventing diffusion of copper is provided for a thin film transistor (Hereinafter, TFT) as a part of the wiring including copper to form the wiring including copper without diffusion of copper into a semiconductor layer of the TFT.

The wiring including copper in the present invention is a wiring including a laminate film of at least a conductive film containing copper as its main component and a barrier conductive film as a barrier against diffusion of copper. In the case of forming a laminate structure of three or more layers, the conductive film containing copper as its main component may be provided as the middle layer. It is noted that it is necessary to provide the barrier conductive film between the conductive film containing copper and an active layer of the TFT.

Further, the present invention has another feature that DC sputtering or evaporation is used with a mask to form the conductive film containing copper as its main component and microfabrication is performed with dry etching to reduce a line width of the conductive film containing copper as its main component. It is noted that the mask used here is formed of a material such as stainless, nickel, glass or quartz and has a pitch more than 5 µm in the opening portion. In addition, it is preferable in the present invention to form the conductive film containing copper as its main component to have a film thickness of 0.1 to 1 µm.

The present invention further has another feature that the wiring containing copper is used for forming a source line (a signal line), a gate line (a scan line), an electric current supply line, and a taken-around wiring.

Beside, since copper used in the present invention is not a preferable material for electric characteristics of the TFT as mentioned above, the present invention further has another feature that the barrier conductive film as a barrier against copper is provided at least between the active layer and the conductive film containing copper as its main component in order to prevent penetration of copper into the active layer of the TFT. As the barrier conductive film, a material selected from tantalum nitride (TaN), titanium nitride (TiN), and tungsten nitride (WN), or a laminate of plural materials thereof may be used.

Consequently, the present invention provides a method of manufacturing a semiconductor device that has a wiring including a laminate of a first conductive film with a property as a barrier (barrier conductive film) and a second conductive film containing copper as its main component, which includes the steps of forming the first conductive film on an insulating surface, making the first conductive film into a desired shape with etching, forming the second conductive film on the first conductive film through an opening portion of a mask, and reducing a width of the second conductive film with dry etching.

It is noted that the present invention includes the case of manufacturing a scan line in accordance with a manufacturing method of a wiring according to the present invention.

Another constitution of the present invention provides a method of manufacturing a semiconductor device that has a first wiring including a laminate of a first conductive film with a property as a barrier and a second conductive film containing copper as its main component, which includes the steps of forming a semiconductor layer on an insulating surface, forming a first insulating film on the semiconductor layer, forming the first conductive film on the first insulating film, making the first conductive film into a desired shape with etching, forming the second conductive film on the first conductive film through an opening portion of a mask, reducing a width of the second conductive film with dry etching, doping an impurity element into the semiconductor layer with the first wiring as a mask to form an impurity region, forming a second insulating film to cover the first wiring, forming a contact hole to reach the impurity region in a portion of the second insulating film, and forming a second wiring electrically connected to the impurity region on the second insulating film.

In the above-mentioned method, the second wiring may be formed in accordance with the steps of forming a third conductive film with a property as a barrier on the second insulating film and making the third conductive film into a desired shape with etching, forming a fourth conductive film containing copper as its main component on the third conductive film through an opening portion of a mask, and reducing a width of the fourth conductive film with dry etching.

Further, another constitution of the present invention provides a method of manufacturing a semiconductor device that has a wiring including a laminate of a first conductive film with a property as a barrier and a second conductive film containing copper as its main component, which includes the steps of forming a semiconductor layer including an impurity region as a part thereof, forming a gate electrode over the semiconductor layer through a first insulating film, forming a second insulating film on the gate electrode, forming a contact hole to reach the impurity region in a portion of the second insulating film, patterning the first conductive film formed on the second insulating film, forming the second conductive film on the first conductive film through an opening portion of a mask, and reducing a width of the second conductive film with dry etching in order to form the wiring electrically connected to the impurity region on the second insulating film.

In each of the above-mentioned methods, an insulating film with a property as a barrier (a barrier insulating film) including one of silicon nitride, silicon oxynitride, aluminum nitride, and aluminum oxynitride may be formed with sputtering to cover the second conductive film.

In the present invention, the wiring including copper is formed to enable making large current flow as well as reducing wiring resistance. Accordingly, it is possible to reduce voltage drop and a round of a signal waveform.

In addition, in the present invention, an area occupied by wirings and electrodes can be reduced since microfabrication of the wiring including copper is possible. It is noted that it is especially effective in the case of manufacturing a middle-sized or large-sized panel with a size of 5 inch or more and making large current flow into a wiring to use the wiring including copper in accordance with the present invention.

BRIEF DESCRIPTION OF THE DRAWINGS

In the accompanying drawings:

FIGS. 2A to 2E are sectional views in the case of using a wiring according to the present invention for a signal line;

FIGS. 8A and 8B are diagrams describing a light emitting device; and

DETAILED DESCRIPTION OF THE PREFERRED EMBODIMENTS

Embodiment modes of the present invention will be described below.

[Embodiment Mode 1]

A manufacturing method of a wiring including copper according to the present invention will be described with FIGS. 1A to 1E.

Figure 1A:
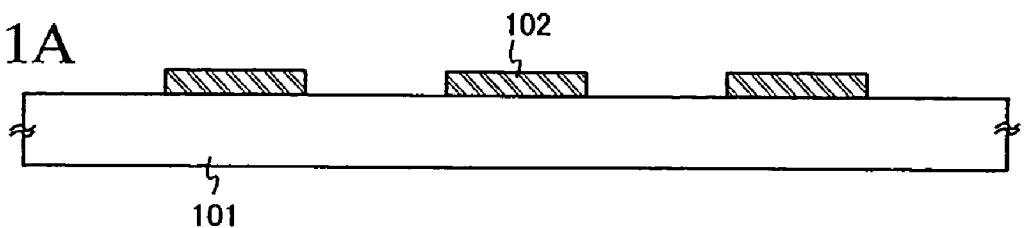
FIGS. 1A to 1E are diagrams describing manufacturing processes of wirings according to the present invention.

In FIG. 1A, pattern formation is performed to form a first conductive film 102 on a substrate 101. As the first conductive film 102 formed here, it is possible to use a film such as a conductive film including TiN (titanium nitride), TaN (tantalum nitride), WN (tungsten nitride), TiC (titanium carbide), TaC (tantalum carbide), or Si (silicon) that has a property as a barrier for preventing penetration of copper from a later formed conductive film including copper. In addition, materials such as Ti, Al, Ta, and W can be used in combination with the materials mentioned above.

The first conductive film is formed with sputtering and subjected to patterning with dry etching to have a line width of 30 to 40 μm.

Figure 1B:
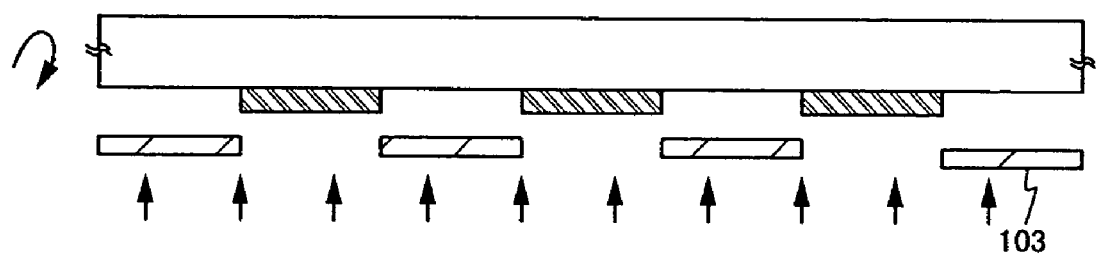
Figure 1C:
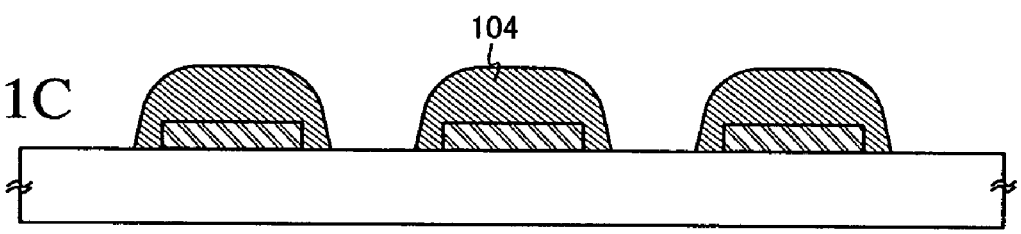
Figure 1D:
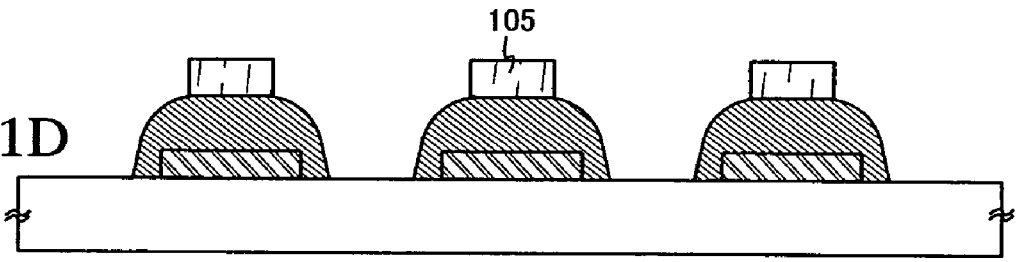

Next, pattern formation is performed using sputtering with a mask 103 as shown in FIG. 1B to form a second conductive film 104 (FIG. 1C). A metal mask is used here as the mask 103.

The second conductive film 104 formed here is formed of a material containing copper as its main component to have a film thickness of 0.1 to 1 μm.

Figure 1E:
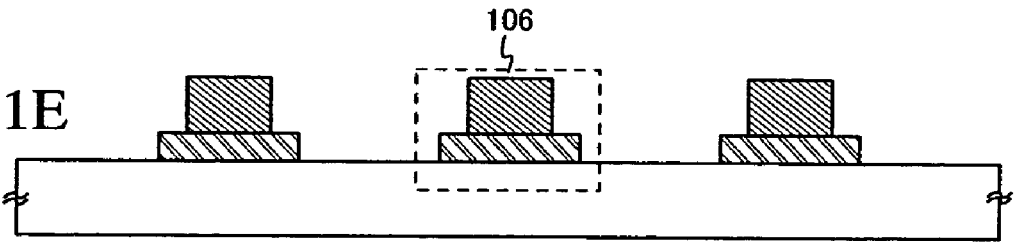

Next, resist 105 is formed on the second conductive film 104 and dry etching with the resist 105 as a mask is performed for microfabrication to obtain a shape 106 (FIG. 1E). In this case, a line width of the second conductive film 104 is 5 to 10 μm. In the etching, dry etching with gas including chlorine is performed providing pressure inside an etching treatment chamber is reduced (including vacuum) and heating or irradiation of light is performed to a surface of the substrate.

It is noted here that it is preferable to form, not shown in the figure, an insulating film (a barrier insulating film) with a property as a barrier for preventing diffusion of copper included in the second conductive film after forming the wiring including copper shown in FIG. 1E. For the barrier insulating film, a material such as silicon nitride, silicon oxynitride, aluminum nitride, aluminum oxynitride, DLC (diamond-like carbon), or carbon nitride (CN) can be used.

[Embodiment Mode 2]

In the present embodiment mode, an explanation will be given on the case that a wiring including copper is used for a signal line (a current supply line is also included in the present embodiment mode) formed in a pixel portion of a display device for inputting a signal from a source driving circuit to each pixel. It is noted that a light emitting device that has a light emitting element with an electroluminescent layer formed to be sandwiched between a pair of electrodes is used as the display device shown in the present embodiment mode.

The light emitting device has plural pixels shown in FIG. 2A in a matrix shape in a pixel portion, and each pixel has a signal line 201, a current supply line 202, a scan line 203, plural TFTs 204 and 205, a capacitor 206, and a light emitting element 207. It is noted that the TFTs 204 and 205 may have a multi-gate structure such as a double-gate structure or a triple-gate structure instead of a single-gate structure.

FIG. 2B shows a top view of FIG. 2A, here has the signal line 201, the current supply line 202, the scan line 203, the plural TFTs 204 and 205, the capacitor 206 formed, and shows a state before forming a pixel electrode to become a first electrode of the light emitting element. It is noted that the pixel electrode is to be later formed in a dotted line portion 209 in FIG. 2B.

The signal line 201 is formed of a laminate film of a barrier conductive film 201a and a conductive film including copper as its main component 201b and the current supply line 202 is formed of a laminate film of a barrier conductive film 202a and a conductive film including copper as its main component 202b.

With respect to connections in FIG. 2B, one of source region and a drain region of the TFT 204 is connected to the signal line 201 and the other is connected to the capacitor 206 and a gate electrode of the TFT 205. A portion of the scan line 203 is a gate electrode of the TFT 204. In addition, one of a source region and a drain region of the TFT 205 is connected to the pixel electrode later formed and the other is connected to the current supply line. The capacitor 206 is formed in a region in which the current supply line 202 and an active layer are laminated.

Next, with respect to a sectional view along A–A' shown in FIG. 2B, different structures will be described with FIGS. 2C to 2E in detail.

In FIG. 2C, a substrate 211 with an insulating surface is shown. It is possible to use a glass substrate, a ceramic substrate, a quartz substrate, a silicon substrate, or a plastic substrate (including a plastic film).

On the substrate 211, a silicon oxynitride film 212a and a silicon oxynitride film 212b are laminated as a base film. Of course, there is no limit on the materials.

On the silicon oxynitride film 212b, a semiconductor film for a semiconductor layer of the TFT 205 and the capacitor 206 (collectively, a semiconductor layer 213) is provided, and the semiconductor layer of the TFT 205 has a source region, a drain region, and a channel forming region provided, and an LDD region and a GOLD structure overlapping with a gate electrode may be formed appropriately.

The semiconductor layer 213 of the TFT is covered with a gate insulating film 214 and a gate electrode of a laminate of tantalum nitride (TaN) 215 and tungsten (W) 216 is provided thereon. In the present embodiment mode, a silicon oxynitride film is used as the gate insulating film 214. Although the metal films of the gate electrode have large selection ratios each other, such structure becomes possible when etching conditions are optimized. With respect to the etching conditions, it is possible to refer to Japanese Patent Laid-Open 2001-313397 by the present applicant.

As an insulating film 217 covering the gate electrode, a silicon nitride film or a silicon oxynitride film is provided. In the present embodiment mode, a silicon oxynitirde film is formed with plasma CVD. In addition, for planarization, a photosensitive or non-photosensitive organic material (polyimide, acrylic, polyamide, polyimideamide, resist, or benzocyclobutene), an inorganic material (such as silicon oxide, silicon nitride, or silicon oxynitride) formed with sputtering, CVD, or coating, or a laminate thereof is used to form a first interlayer insulating film 218a on the insulating film 217.

On the first interlayer insulating film 218a, a first barrier insulating film 219 including a nitrided insulating film (typically, a silicon nitride film or a silicon oxynitride film) is formed. In the present embodiment mode, a silicon nitride film is used for the first barrier insulating film 219. After that, a contact hole (an opening portion) in the first barrier insulating film 219, the first interlayer insulating film 218a, the insulating film 217, and the gate insulating film 214 with wet etching or dry etching.

It is noted that the contact hole shown in FIG. 2C and provided in the first interlayer insulating film 218a has a tapered shape in which a diameter becomes smaller toward the bottom and an angle (a portion indicated by a broken line 221a in FIG. 2C) made by a top surface of the first interlayer insulating film 218 and a slope of the contact hole (a corner portion of the contact hole) is on the order of 95 to 135 degree.

Next, a conductive material with a property as a barrier is used to form barrier conductive films 201a and 202a and a wiring 220, subjected to pattering etching (dry etching or wet etching).

Next, sputtering with a metal mask is used to perform pattern formation of conductive films containing copper as their main component 201b and 202b respectively on the barrier conductive films 201a and 202a, and microfabrication is further performed with dry etching. It is noted that it is possible to refer to Embodiment Mode 1 with respect to a manufacturing method of the conductive films 201b and 202b.

According to the processes described above, the signal line 201 is formed of the barrier conductive film 201a and the conductive film containing copper as its main component 201b and the current supply line 202 is formed of the barrier conductive film 202a and the conductive film containing copper as its main component 202b.

Next, an explanation will be given with FIG. 2D on a structure in which a contact hole has a corner portion (a portion indicated by a broken line 221b in FIG. 2D) rounded and a shape in which a diameter becomes smaller toward the bottom. As a material of a first interlayer insulating film 218b in this case, a photosensitive or non-photosensitive organic material (polyimide, acrylic, polyamide, polyimideamide, resist, or benzocyclobutene) may be used, and wet etching or dry etching may be used to form the contact hole.

Further, an explanation will be given with FIG. 2E on a structure in which a shape of a tapered portion in a contact hole is different from FIG. 2D, the contact hole (a portion indicated by a broken line 221c in FIG. 2E) has a corner portion rounded and a slope with two or more different curvature radiuses. At this time, a photosensitive or non-photosensitive organic material (polyimide, acrylic, polyamide, polyimideamide, resist, or benzocyclobutene) may be used as a material of a first interlayer insulating film 218c and wet etching or dry etching may be used to form the contact hole.

Such shape of the contact hole formed in the interlayer insulating film can prevent breaking of the wiring 220 provided for the TFT 205.

Figure 3A:
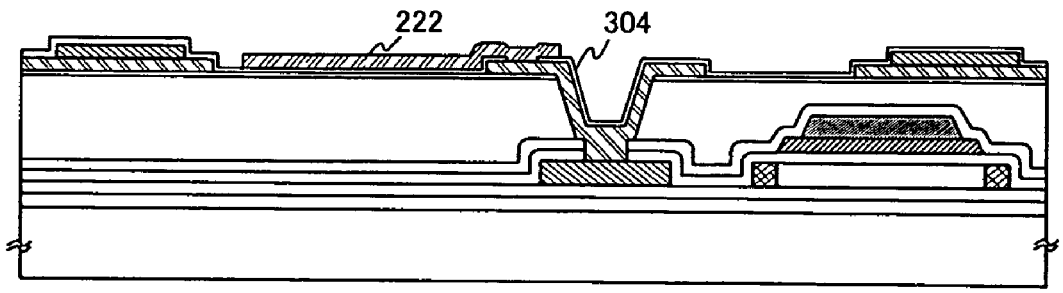
FIGS. 3A to 3D are sectional views in the case of using the wiring according to the present invention for the signal line.

Note that it is preferable to form an insulating film 304 for covering the conductive films containing copper as their main component 201b and 202b as shown in FIG. 3A after forming the conductive films containing copper as their main component 201b and 202b as shown in FIGS. 2C to 2E. The insulating film 304 may be formed of silicon nitride (SiN) or silicon oxynitride (SiNO). In the present embodiment mode, silicon nitride is formed with high frequency sputtering. When the conductive films containing copper as their main component 201b and 202b are covered with the insulating film 304 in this way, it is possible to prevent copper included in the conductive films from diffusing into an active layer of the TFT.

Then, an opening portion is formed with photolithography at a position that is a portion of the insulating film 304 and is overlapped with the wiring 220 and a pixel electrode 222 is formed. Accordingly, the pixel electrode 222 and the wiring 220 are electrically connected through the opening portion.

Figure 3B:
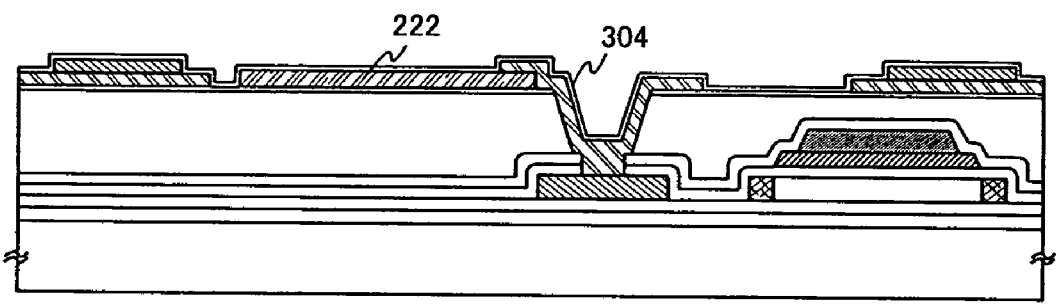
Figure 3C:
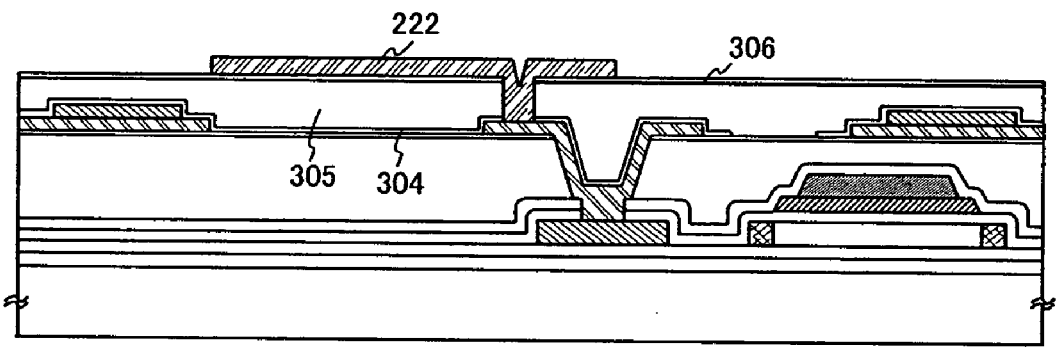
Figure 3D:
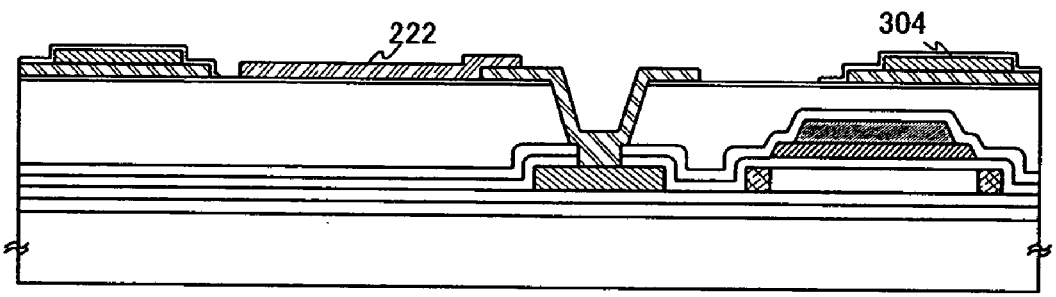

It is noted that a sequence of manufacturing the wiring 220, the insulating film 304, and the pixel electrode 222, a manufacturing method of the opening portion in the insulating film 304, or a manufacturing method of the insulating film is different in each of FIGS. 3B to 3D.

In FIG. 3B, for example, the signal line 201 and the current supply line 202, each including the barrier conductive film and the conductive film containing copper as its main component, and the wiring 220 including the barrier conductive film are formed after forming the pixel electrode 222. Lastly, an opening portion is provided in the insulating film 304.

In a structure of FIG. 3C, the wiring 220, the signal line 201, and the current supply line 202 are formed similarly to FIG. 3A. In this case, however, a second interlayer insulating film 305 is formed and a second barrier insulating film 306 is formed on the second interlayer insulating film 305. Then, an opening portion is formed in the second interlayer insulating film 305 and the second barrier insulating film 306 to form the pixel electrode 222 electrically connected the wiring 220 in the opening portion. It is noted that the second interlayer insulating film 305 may be formed of the same material with the same means as the first interlayer insulating film 218a, 21b, or 218c and the second barrier insulating film 306 may be formed of the same material with the same means as the first barrier insulating film 219.

In a structure of FIG. 3D, a manufacturing method of the insulating film 304 is different from the case in FIGS. 3A to 3C, and the insulating film 304 is formed with a mask only on the wiring including copper. Accordingly, it is not necessary in this case to form an opening portion with photolithography in the insulating film 304. Note it is possible to adapt the structure shown in FIG. 3D to a manufacturing method of the insulating film 304 of the structures shown in FIGS. 3A to 3C.

In the case of forming the insulating film 304 only on the wiring including copper as shown in FIG. 3D, the same material as the barrier conductive films 201a and 202a can be used instead of the insulating film 304.

Further, with FIGS. 4A to 4D, an explanation will be given on a method for forming a bank (also called a partition or a barrier) covering an end portion of the pixel electrode, the wiring, the signal line, and the scan line after forming the pixel electrode 222 as shown in FIG. 3A and forming a light emitting layer and a second electrode of the light emitting element on the pixel electrode.

Figure 4A:
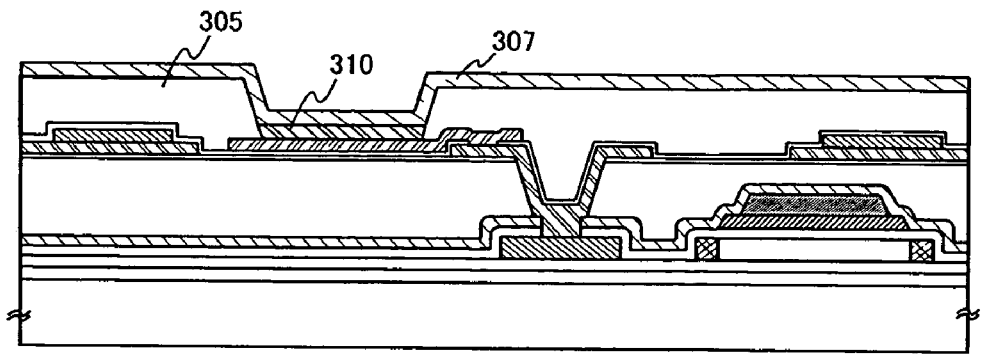
FIGS. 4A to 4D are sectional views in the case of using the wiring according to the present invention for the signal line.

In FIG. 4A, in addition to the structure shown in FIG. 3A, an opening portion is formed on the pixel electrode 222 after forming the second interlayer insulating film 305 entirely. A photosensitive or non-photosensitive organic material (polyimide, acrylic, polyamide, polyimideamide, resist, or benzocyclobutene), an inorganic material (such as silicon oxide, silicon nitride, or silicon oxynitride) formed with sputtering, CVD, or coating, or a laminate thereof is used to form the second interlayer insulating film 305. In the case of a photosensitive organic material for the second interlayer insulating film, it is possible in the present invention to use any of a negative photosensitive organic material that becomes insoluble in an etchant with light and a positive photosensitive organic material that becomes soluble in an etchant with light.

In the opening portion, a light emitting layer 310 including an organic compound is formed, and a second electrode 307 is formed on the light emitting layer 310. It is preferable to perform heating under vacuum for degassing before or after forming the light emitting layer 310. Also, it is preferable that a surface of the first electrode is planarized since the light emitting layer 310 including the organic compound is extremely thin, and for example, planarization may be performed with treatment of chemical mechanical polishing (typically, CMP) before or after patterning of the pixel electrode 222. In addition, cleaning (brush cleaning or bellclean cleaning) for cleaning foreign particles (such as dusts) may be performed in order to improve cleanness of the surface of the pixel electrode.

It is noted that the opening portion of the second interlayer insulating film 305, shown in FIG. 4A, has a tapered shape in which a diameter becomes smaller toward the bottom and an angle made by a top surface of the second interlayer insulating film 305 and a slope of the opening portion (a corner portion of the opening portion) is on the order of 95 to 135 degree.

Figure 4B:
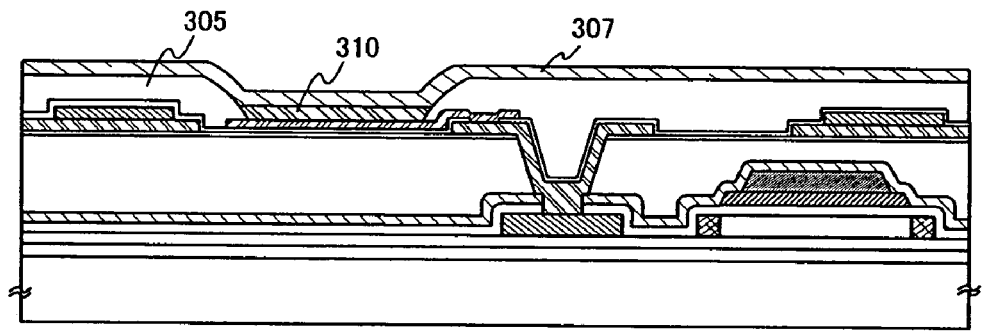

A structure shown in FIG. 4B is different from that in FIG. 4A in which the corner portion of the opening portion has the tapered shape with the degree. In FIG. 4B, an opening portion has a corner portion rounded and a diameter that becomes smaller toward the bottom. As a material of the second interlayer insulating film 305, a photosensitive or non-photosensitive organic material (polyimide, acrylic, polyamide, polyimideamide, resist, or benzocyclobutene) may be used, and wet etching or dry etching may be used to form the opening portion.

Figure 4C:
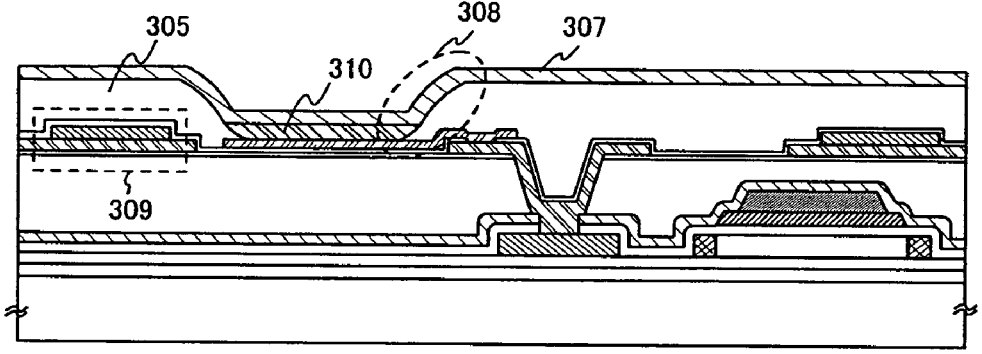

Further, another different tapered shape of an opening portion is shown in FIG. 4C. The opening portion has a corner portion rounded and a slope with two or more different curvature radiuses. As a material of the second interlayer insulating film 305, a photosensitive or non-photosensitive organic material (polyimide, acrylic, polyamide, polyimideamide, resist, or benzocyclobutene) may be used, and wet etching or dry etching may be used to form the opening portion.

Figure 4D:
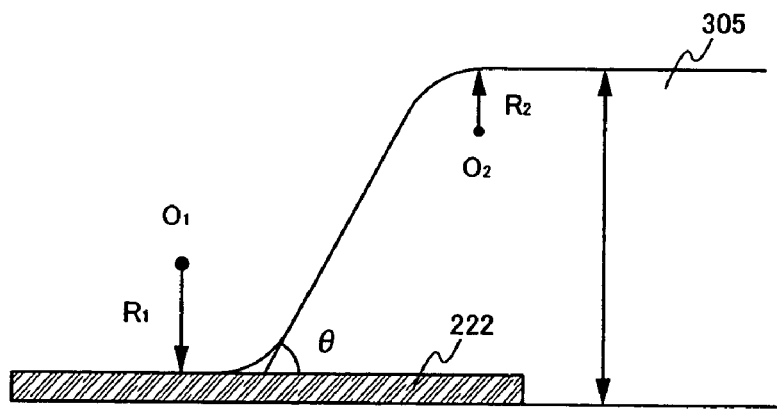

With respect to the shape of the opening portion of the second interlayer insulating film 305 in FIG. 4C, an enlarged view of a portion indicated by a dotted line 308 is shown in FIG. 4D. Namely, the bottom portion is in contact with the top surface of the pixel electrode 222 and has a curved side surface that depends on a center of the curvature ($O_1$) above a contact point between the pixel electrode 222 and a surface of the bottom portion and the first curvature radius ($R_1$), and the top portion is in contact with a top surface of the second interlayer insulating film 305 and has a curved side surface that depends on a center of the curvature ($O_2$) below a contact point between a surface of the top portion and the top surface and the first curvature radius ($R_2$).

Although FIGS. 4A to 4C is described based on the structure shown in FIG. 3A, it is possible to combine any of the structure shown in FIGS. 3B to 3D, and further FIGS. 2D and 2E.

With respect to specific laminate structures of Wirings formed in accordance with the present invention, an explanation will be given with FIGS. 5A to 5D. It is noted that FIGS. 5A to 5D show structures of a region 309 illustrated in FIG. 4C.

Figure 5A:
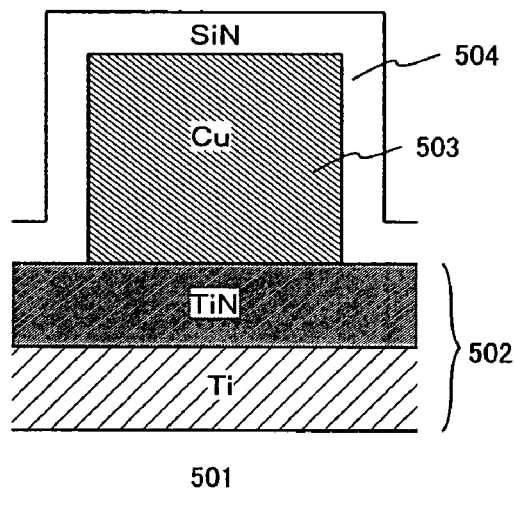
FIGS. 5A to 5D are diagrams describing examples of wiring structures according to the present invention.

In FIG. 5A, a Ti film and a TiN film are laminated on an insulating film 501 to form a barrier conductive film 502. That is, it is the Ti film that a first formed film on the insulating film 501 is, and the TiN film as a barrier against Cu is on the Ti film. Then, a Cu film is formed on the barrier conductive film 502 as a conductive film containing copper as its main component 503. Here, a barrier insulating film 504 of a SiN film is formed on the Cu film.

Figure 5B:
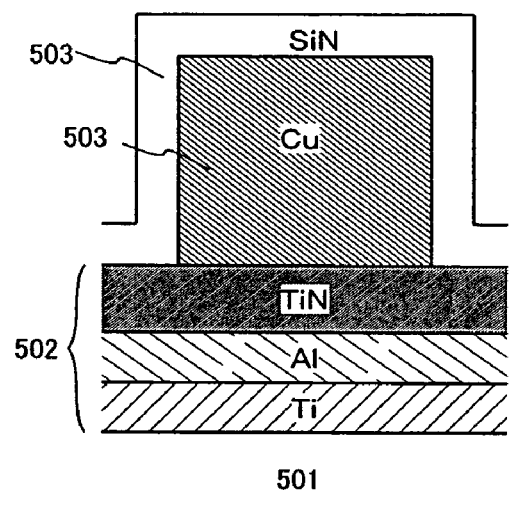

In FIG. 5B, more layers are laminated for the barrier conductive films 502, that is, a Ti film, an Al film, and a TiN film are laminated.

Figure 5C:
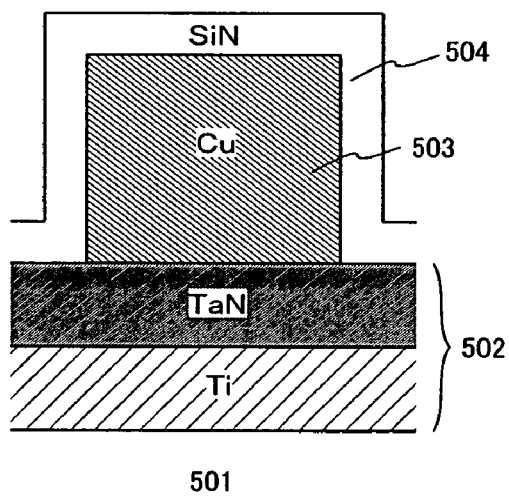
Figure 5D:
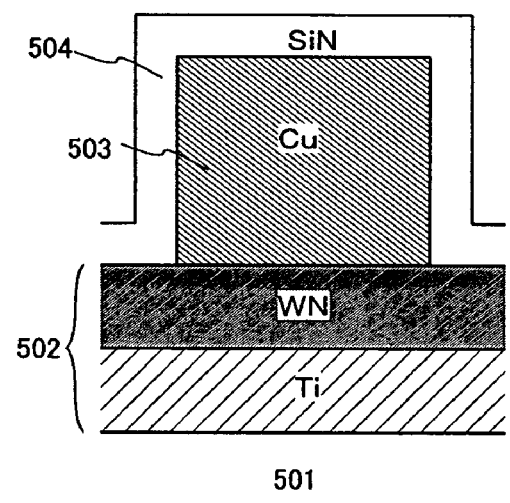

Further, the barrier conductive film 502 has a laminate structure of a Ti film and a TaN film in FIG. 5C, and has a laminate structure of a Ti film and a WN film in FIG. 5D. It is noted that the barrier insulating film 504 is formed also in each of FIGS. 5B to 5D similarly to FIG. 5A.

It is noted that FIGS. 5A to 5D shown here are examples of the wiring structure formed of a laminate of conductive films according to the present invention and there is no limitation on the combination providing the above-mentioned materials are combined.

[Embodiment Mode 3]

In the present embodiment mode, an example in which a wiring including copper is applied to a gate electrode will be described with reference to FIGS. 6A to 6C.

Figure 6A:
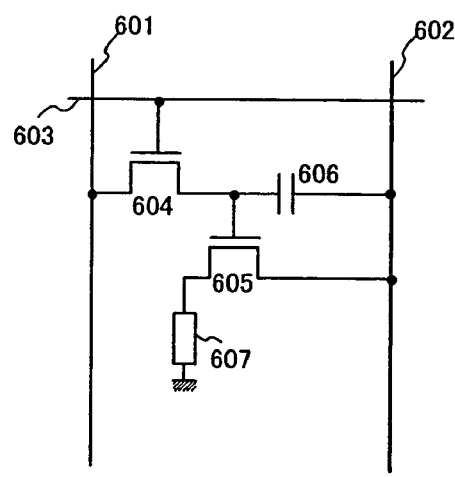
FIGS. 6A to 6C are sectional views in the case of using a wiring according to the present invention for a scan line.

FIG. 6A shows an equivalent circuit of a pixel in a light emitting device. As shown in FIG. 6A, the pixel has at least a signal line 601, a current supply line 602, a scan line 603, plural TFTs 604 and 605, a capacitor 606, and a light emitting element 607. It is noted that the TFTs 604 and 605 may have a multi-gate structure such as a double-gate structure or a triple-gate structure instead of a single-gate structure.

Figure 6B:
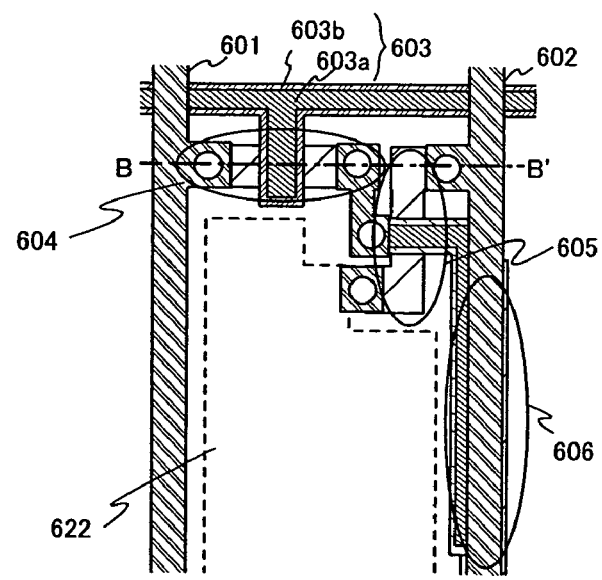

Further, FIG. 6B shows a top view of FIG. 6A in which a pixel electrode (a first electrode of the light emitting element) 622 is formed, and has the signal line 601, the current supply line 602, the scan line 603, TFTs 604 and 605, the capacitor 606, and the pixel electrode 622 of the light emitting element. As the scan line 603 and a gate electrode of the TFT 604, a barrier conductive film 603a and a conductive film containing copper as its main component 603b thereon are provided.

Figure 6C:
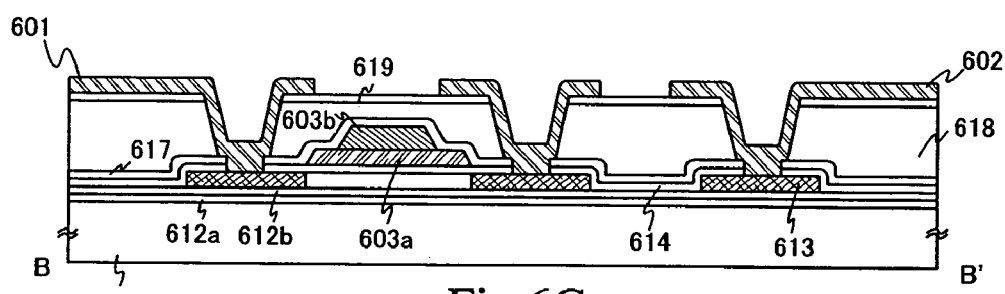

FIG. 6C shows a sectional view along B–B' in FIG. 6B. Similarly to FIG. 2C, a substrate 611 with an insulating surface, a silicon oxynitride film 612a and a silicon oxynitride film 612b as a base film, a semiconductor film 613 of the TFTs 604 and 605 are provided. Then, a gate insulating film 614 is provided to cover the semiconductor film 613, and the barrier conductive film 603a and the conductive film containing copper as its main component 603b are formed over the semiconductor film 613. Namely, the present embodiment mode is characterized in that the wiring including copper is used for the gate electrode. It may be possible to refer to Embodiment Mode 1 on a manufacturing method of the wiring including copper. The barrier conductive film 603a is formed using one selected from tantalum nitride (TaN), titanium nitride (TiN), and tungsten nitride (WN) or a laminate film of plurality thereof, and has a function as a protective film for preventing penetration of copper due to diffusion into the semiconductor film 613.

The same layer as the gate electrode is subjected to patterning to form the scan line 603 at the same time as the gate electrode. That is, the scan line 603 has a laminate structure of the barrier conductive film 603a and the conductive film containing copper as its main component 603b.

Then, source region, a drain region, and a channel forming region in the semiconductor film 613 are formed with gate electrode or resist as a mask. Additionally, an LDD region and a GOLD structure overlapped with the gate electrode may appropriately be formed. It is noted that the source region, the drain region, or the LDD region to which an impurity is doped is called an impurity region. As an insulating film 617 covering the gate electrode, a silicon nitride film or a silicon oxynitride film is provided.

In order to activate the impurity regions, heating furnace or laser is used. At this time, it is preferable to irradiate laser (for example, excimer laser) from a back surface (a backside of the side with the semiconductor film formed) of the substrate for the activation in order to prevent copper from diffusing to penetrate into the semiconductor film due to heating in the activation. More preferably, the impurity regions are formed after forming the barrier conductive film 603a, the heating furnace or laser is used to activate the impurity regions, and then the conductive film containing copper as its main component 603b is formed.

In addition, for planarization, a photosensitive or non-photosensitive organic material (polyimide, acrylic, polyamide, polyimideamide, resist, or benzocyclobutene), an inorganic material (such as silicon oxide, silicon nitride, or silicon oxynitride) formed with sputtering, CVD, or coating, or a laminate thereof is used to form an interlayer insulating film 618 on the insulating film 617.

On the interlayer insulating film 618, a barrier insulating film 619 including a nitrided insulating film (typically, a silicon nitride film or a silicon oxynitride film) is formed. It is noted that the barrier insulating film mentioned here indicates an insulating film that has a function of preventing diffusion of copper In the present embodiment mode, a silicon nitride film is used for the barrier insulating film 619. Then, wet etching or dry etching is used to form a contact hole (an opening portion) in the barrier insulating film 619, the interlayer insulating film 618, the insulating film 617, and the gate insulating film 614. As a shape of the contact hole, that is, a shape of the interlayer insulating film, any structure of FIGS. 2C to 2E may be applied.

In the contact hole, a wiring is formed and connected to the source region or the drain region, and patterning of the same layer as the wiring forms the signal line 601 and the current supply line 602 at the same time. After that, a light emitting layer and the like are formed as shown in FIGS. 3A to 3D and FIGS. 4A to 4C. It is noted that any structure of FIGS. 3A to 3D may be employed for a pixel electrode to be formed and any of FIGS. 4A to 4C may be used as a structure of an insulating film and the like for forming the light emitting layer.

In this way, it is possible to apply the wiring including copper to the gate electrode and the scan line.

When the wiring including copper is applied to the gate electrode and the scan line as set fourth above, it is possible to reduce voltage drop and a round of a waveform and further to achieve a narrowed frame of the display device.

[Embodiment Mode 4]

A wiring obtained according to the manufacturing method of the present invention can be applied to a wiring taken around in a display device.

Figure 7A:
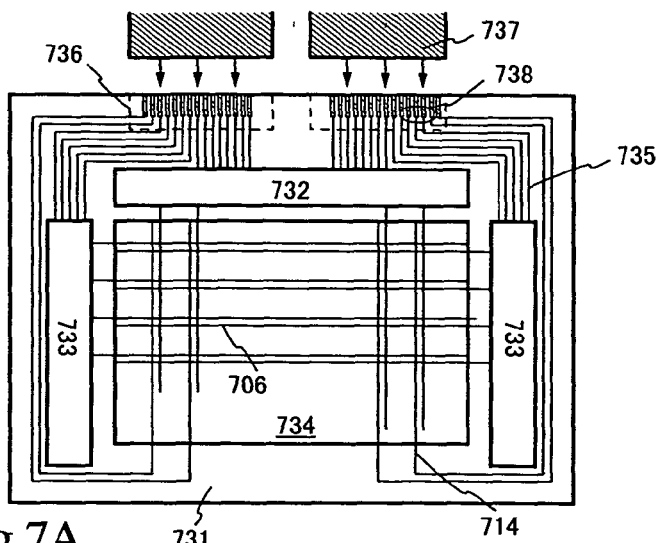
FIGS. 7A to 7D are sectional views in the case of using a wiring according to the present invention for a taken-around wiring.

On a substrate 731 shown in FIG. 7A, a driving circuit portion of a source side driving circuit 732 and a gate side driving circuit 733, and a pixel portion 734 are formed, and the source side driving circuit 732 and the gate side driving circuit 733 are connected to the outside via taken-around wirings 735. That is, a wiring according to the present invention can be used for the taken-around wirings 735 shown here. In the case of a light emitting device, a current supply line 714 and a second electrode (not shown in the figure) of a light emitting element formed in each pixel of the pixel portion 734 are also connected to the outside via taken-around wirings. It is preferable in the present embodiment mode that a wiring including copper formed as the taken-around wiring has a line width of 900 to 1500 μm, and on the order of 100 to 200 μm in a connecting portion to a FPC.

It is noted that the taken-around wirings are connected to a FPC 737 in a connecting portion 736.

Figure 7B:
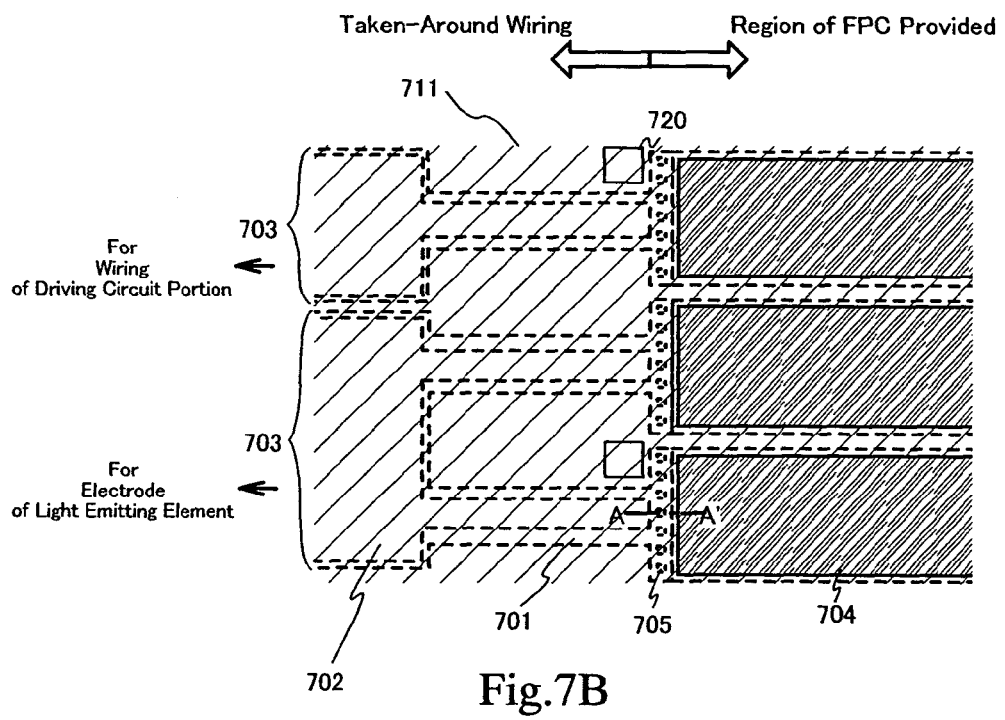

Here, a structure of a region 738 shown in FIG. 7A is shown in detail in FIG. 7B. In FIG. 7B, a reference number 701 indicates a barrier conductive film and a reference number 702 indicates a conductive film containing copper as its main component formed to be laminated on the barrier conductive film 701. Then, a wiring of the laminate thereof is covered with a second insulating film 711. In a contact hole 705 provided in a first insulating film 707, the barrier conductive film 701 is electrically connected to a scan line 706. Since a transparent conductive film 704 formed at the same time as a pixel electrode in the pixel portion 734 has the formed second insulating film 711 thereon removed, the surface of the transparent conductive film 704 is exposed in the top view of FIG. 7B.

Figure 7C:
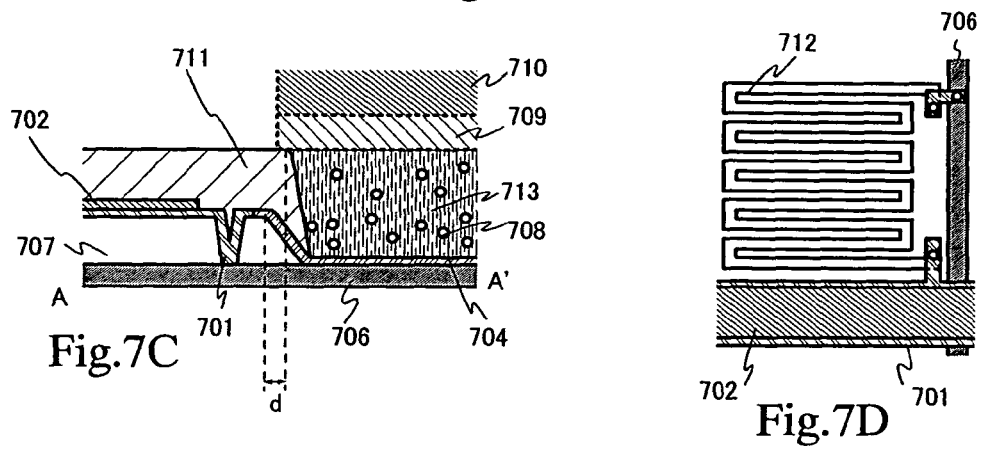

FIG. 7C shows a sectional view along A–A' in FIG. 7B. First, on a wiring 706 formed at the same time as the scan line, the first insulating film 707 formed at the same time as an interlayer insulating film is provided. After that, the barrier conductive film 701 as the taken-around wiring is formed in the contact hole (opening portion) 705 formed in the first insulating film 707, and is connected to the wiring 706 through the contact hole. On the barrier conductive film 701, the conductive film containing copper as its main component 702 subjected to patterning is formed to extend to a short of the contact hole. Then, the transparent conductive film 704 is formed to have contact with the barrier conductive film 701, extending from a position on the first insulating film 707.

Next, the second insulating film 711 is formed over the first insulating film to cover the barrier conductive film 701 and the conductive film containing copper as its main component 702, and the opening portion is formed in the second insulating film 711 to cover a periphery (called also an edge or a frame) of the transparent conductive film 704 and make the surface thereof exposed (the top view of the FIG. 7B). It is noted that a margin between the first and second insulating films 707 and 711 is set to several μm, for example, 3 μm.

Figure 7D:
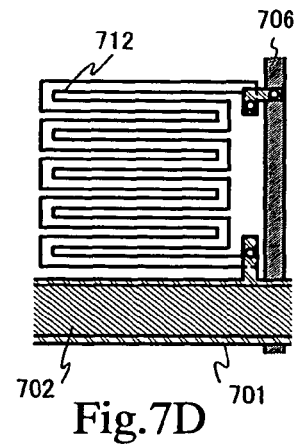

Here, FIG. 7D shows an enlarged view of a protective circuit 720 and its vicinity. In the vicinity of a connecting region to the FPC (Hereinafter, a connecting region), a semiconductor layer 712 formed at the same time as a semiconductor layer of TFT has a rectangle provided stepwise (zigzag). Then, the semiconductor layer 712 is connected to the barrier conductive film 701 and the wiring 706 through a contact hole to function as the protective circuit. With such protective circuit provided, the semiconductor layer functions as a resistor to be able to prevent excessive current due to static electricity and the like from flowing to the driving circuit portion and the pixel portion. Besides, a TFT may be provided instead of the semiconductor layer, or in combination with the semiconductor layer.

Further, the connection between a terminal of the FPC and the taken-around wiring is different in the case of connecting the taken-around wiring to the electrode of the light emitting element from the case of connecting the taken-around wiring to the wiring of the driving circuit portion. That is, in the case of connecting the taken-around wiring to the electrode of the light emitting element, a wider width of the taken-around wiring is designed and two FPC terminals are connected with respect to the taken-around wiring since it is desired to lower resistance as much as possible. On the other hand, in the case of connecting the taken-around wiring to the wiring of the driving circuit portion, a narrower width of the taken-around wiring is designed, compared to the above-mentioned case, and one FPC terminal is connected with respect to the taken-around wiring. In this way, the number of connected FPC terminals is set in consideration of the object connected to the taken-around wiring. Furthermore, the protective circuit may be provided with respect to each electrode of the light emitting elements and each wiring of the driving circuit portion.

Then, not shown in the top view of FIG. 7A, resin 713 including a conductor 708 is formed on the opening portion of the second insulating film 711, and connected to a FPC 710 through a wiring 709 provided at the FPC side.

As set forth above, in the present embodiment mode, the conductive film containing copper as its main component 702 is provided at the predetermined position of the taken-around wiring to reduce wiring resistance, and it is possible to prevent heat from generating from the wiring. Especially, in the case of a middle-sized or a large-sized panel, it is necessary to make large current flow. Accordingly, it is useful to use the conductive film containing copper as its main component 702 as the present invention since there is an advantage that large current can be made to flow.

[Embodiment Mode 5]

In Embodiment Mode 5, an explanation will be given with FIGS. 8A and 8B on an appearance of an active matrix light emitting device of semiconductor devices according to the present invention. FIG. 8A is a top view showing the light emitting device and FIG. 8B is a sectional view along A–A' in FIG. 8A. A portion 801 surrounded by a dotted line shows a driving circuit portion (source side driving circuit), a portion 802 surrounded by another dotted line shows a pixel portion, and a portion 803 surrounded by further another dotted line shows a driving circuit portion (gate side driving circuit). In addition, a sealing substrate 804 and a sealing material 805 are provided, and the inside surrounded by the sealing material 805 is an interspace 807.

A wiring (taken-around wiring) 808 has a function of transmitting signals to be input to the source side driving circuit 801 and the gate side driving circuit 803, and receives signals such as a video signal, a clock signal, a start signal, and a reset signal from a FPC (Flexible Printed Circuit) 809 as an external input terminal. Although only the FPC is shown here, a printed wiring board (PWB) may be attached to the FPC. The light emitting device in the present specification includes not only the light emitting device itself but also a state in which the FPC or the PWB is attached thereto.

Next, a sectional structure will be described with FIG. 8B. The source side driving circuit 801 of the driving circuit portion and the pixel portion 802 are shown here, of the driving circuit portion and the pixel portion formed on an element substrate 810.

In the source side driving circuit 801, a CMOS circuit in which an n-channel TFT 823 and a p-channel TFT 824 are combined is formed. The TFT for composing the driving circuit may be formed of a known CMOS circuit, PMOS circuit, or NMOS circuit. It is not always necessary to form the driving circuit on the substrate integrally as the present embodiment mode, and it is also possible to form the driving circuit not on the substrate but outside the substrate externally.

The pixel portion 802 includes plural pixels, and each of the plural pixels includes a switching TFT 811, a current controlling TFT 812, and a first electrode 813 that is a pixel electrode electrically connected to a drain region of the current controlling TFT 812. Further, a bank 814 is formed to cover an end portion of the first electrode 813. Here, a positive photosensitive acrylic resin film is used to form the bank 814.

In addition, a top or bottom portion of the bank 814 is made to have a curved surface with a curvature formed in order to improve the coverage. For example, in the case of using positive photosensitive acrylic as a material of the bank 814, it is preferable that only the top portion of the bank 814 is made to have a curved surface with a curvature radius (0.2 μn to 3 μm). Besides, for the bank 814, it is possible to use any of a negative photosensitive material that insoluble in an etchant with light and a positive photosensitive material that soluble in an etchant with light.

On the first electrode 813, an electroluminescent layer 816 and a second electrode 817 are formed. Here, it is preferable to use a material with a large work function as a material used for the first electrode 813. For example, it is possible to use a laminate of a titanium nitride film and a film containing aluminum as its main component or a three-layer structure of a titanium nitride film, a film containing aluminum as its main component, and a titanium nitride film, in addition to a single layer film such as a titanium nitride film, a chromium film, a tungsten film, a zinc film, or a platinum film. When the laminate structure is employed for the first electrode 813, it becomes possible to have lower resistance as a wiring, to obtain good ohmic contact, and further to make the first electrode 813 function as anode.

Further, the electroluminescent layer 816 is formed with inkjet or evaporation with an evaporation mask.

Furthermore, as a material for the second electrode (cathode) 817 formed on the electroluminescent layer 816, a material with a small work function (Al, Ag, Li, Ca, an alloy such as MgAg, MgIn, or AlLi, CaF$_2$, or CaN) may be used. Here, a laminate of a metal film with a film thickness thinned and a transparent conductive film (ITO: indium oxide-tin oxide alloy, In$_2$O$_3$—ZnO: indium oxide-zinc oxide alloy, ZnO: zinc oxide, or the like) is used as the second electrode (cathode) 817 in order to transmit emitted light.

In addition, the second electrode 817 that functions also as a common wiring to all pixels is electrically connected to the FPC 809 via the taken-around wiring 808.

The sealing substrate 804 is bonded to the element substrate 810 with the sealing material 805 to make it possible to seal a light emitting element 818, that is, the light emitting device 818 is provided in the interspace 807 surrounded by the element substrate 801, the sealing substrate 804, and the sealing material 805.

It is noted that it is preferable to use epoxy resin for the sealing material 805. A material that prevents transmission of moisture and oxygen as much as possible is desirable.

Further, as the sealing substrate 804, a plastic substrate including a material such as FRP (Fiberglass-Reinforced Plastics), PVF (polyvinyl fluoride), Mylar, polyester, or acrylic can be used in addition to a glass substrate and a quartz substrate in the present embodiment mode.

It is noted that Embodiment Mode 5 can be freely combined with any of Embodiment Modes 1 to 4.

[Embodiment Mode 6]

It is able to make various electric apparatus complete to employ a semiconductor device manufactured with a wiring according to the present invention. Some examples will be described with FIGS. 9A to 9C.

Figure 9A:
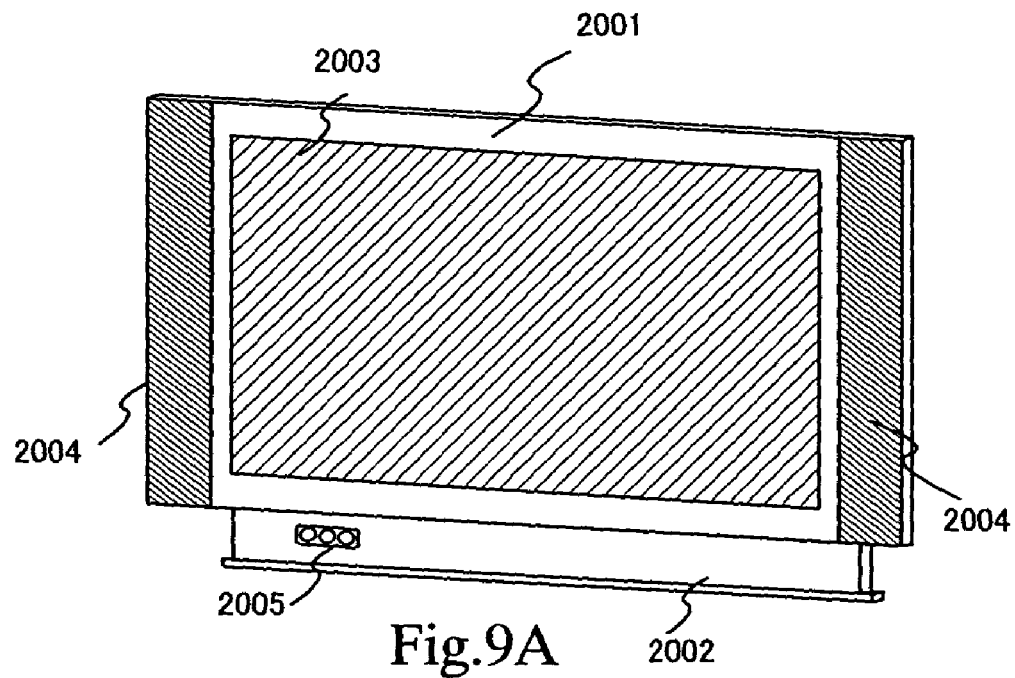
FIGS. 9A to 9C are diagrams describing electric apparatus.

FIG. 9A illustrates a display device which includes a casing 2001, a support table 2002, a display portion 2003, a speaker portion 2004, a video input terminal 2005 and the like. In manufacturing the display device, a semiconductor device with a wiring structure according to the present invention is used for the display portion 2003 thereof. It is noted that a semiconductor device with a wiring structure of the present invention is suitable for a large-sized display device since wiring resistance can be reduced. The display device includes a liquid crystal display device and a light emitting device, and specifically, all display devices for displaying information, such as a personal computer, a receiver of TV broadcasting and an advertising display.

Figure 9B:
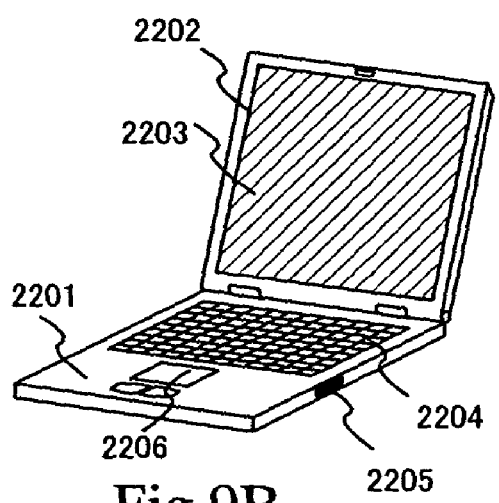

FIG. 9B illustrates a lap-top computer which includes a main body 2201, a casing 2202, a display portion 2203, a keyboard 2204, an external connection port 2205, a pointing mouse 2206, and the like. In manufacturing the lap-top computer, a semiconductor device with a wiring structure according to the present invention is used for the display portion 2203 thereof.

Figure 9C:
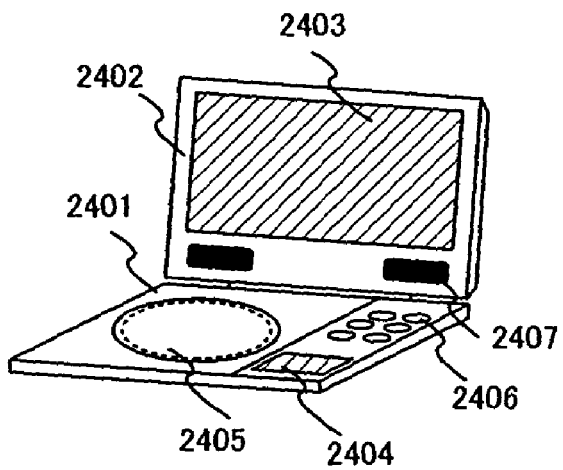

FIG. 9C illustrates a portable image reproduction device including a recording medium (specifically, a DVD reproduction device), which includes a main body 2401, a casing 2402, a display portion A 2403, another display portion B 2404, a recording medium (DVD or the like) reading portion 2405, an operation key 2406, a speaker portion 2407 and the like. The display portion A 2403 is used mainly for displaying image information, while the display portion B 2404 is used mainly for displaying character information. In manufacturing the image reproduction device including a recording medium, a semiconductor device with a wiring structure according to the present invention is used for the display portions A and B 2403 and 2404 thereof The image reproduction device including a recording medium further includes a home game machine or the like.

As set forth above, a semiconductor device according to the present invention can be applied quite widely to electric apparatus in various fields. Besides, it is able to make the electric apparatus in Embodiment Mode 6 complete to use a semiconductor device manufactured in accordance with any of Embodiment Mode 1 to 5.

The present invention makes it possible in semiconductor devices such as a light emitting device and a liquid crystal display device to reduce problems in realizing a large-sized screen such as voltage drop and signal delay caused by wiring resistance and to improve an operation speed of a driving circuit portion and uniformity of an image quality in a pixel portion.

What is claimed is:

1. A method of manufacturing a semiconductor device comprising the steps of:
   forming a semiconductor layer over an insulating surface;
   forming a first insulating film over the semiconductor layer;
   forming a first wiring comprising at least a laminate of a first conductive film with a property as a barrier and a second conductive film containing copper as its main component, said step of forming a first wiring including the steps of:
      (i) forming the first conductive film over the first insulating film;
      (ii) etching the first conductive film;
      (iii) forming the second conductive film on the first conductive film through an opening of a mask;
      (iv) reducing a width of the second conductive film with dry etching;
   doping an impurity element into the semiconductor layer with the first wiring as a mask to form an impurity region;
   forming a second insulating film over the first wiring;
   forming a contact hole to reach the impurity region in the second insulating film; and
   forming a second wiring electrically connected to the impurity region over the second insulating film.

2. A method of manufacturing a semiconductor device according to claim 1 further comprising the steps of:
   forming a third conductive film with a property as a barrier over the second insulating film;
   etching the third conductive film;
   forming a fourth conductive film containing copper as its main component on the third conductive film through an opening of a mask; and
   reducing a width of the fourth conductive film with dry etching to form the second wiring.

3. A method according to claim 1, wherein the first conductive film comprises TiN as its main component.

4. A method according to claim 1, wherein the first conductive film comprises a laminate of a film containing Ti as its main component and a film comprising one of TiN, TaN, WN, TiC, TaC, and silicon.

5. A method according to claim 1, wherein the first conductive film comprises a laminate of a film containing Ti as its main component and a film comprising one of TiN, TaN, WN, TiC, TaC, and silicon formed on the film containing Ti as its main component.

6. A method of manufacturing a semiconductor device according to claim 1, wherein an insulating film with a property as a barrier comprising at least one of silicon nitride, silicon oxynitride, aluminum nitride, and aluminum oxynitride is formed with sputtering to cover the second conductive film.

7. A method of manufacturing a semiconductor device according to claim 2, wherein an insulating film with a property as a barrier comprising at least one of silicon nitride, silicon oxynitride, aluminum nitride, and aluminum oxynitride is formed with sputtering to cover the fourth conductive film.

8. A method of manufacturing a semiconductor device comprising the steps of:
   forming a semiconductor layer over an insulating surface;
   forming a first insulating film over the semiconductor layer;
   forming a first wiring comprising at least a laminate of a first conductive film with a property as a barrier and a second conductive film containing copper as its main component, said step of forming a first wiring including the steps of:
      (i) forming the first conductive film over the first insulating film;
      (ii) etching the first conductive film;
      (iii) forming the second conductive film on the first conductive film through an opening of a mask;
      (iv) reducing a width of the second conductive film with dry etching;
   doping an impurity element into the semiconductor layer with the first wiring as a mask to form an impurity region;
   forming a second insulating film over the first wiring;
   forming a third insulating film over the second insulating film;
   forming a contact hole to reach the impurity region in the second insulating film and the third insulating film; and
   forming a second wiring electrically connected to the impurity region over the third insulating film.

9. A method of manufacturing a semiconductor device according to claim 8 further comprising the steps of:
   forming a third conductive film with a property as a barrier over the third insulating film;
   etching the third conductive film;
   forming a fourth conductive film containing copper as its main component on the third conductive film through an opening of a mask; and
   reducing a width of the fourth conductive film with dry etching to form the second wiring.

10. A method of manufacturing a semiconductor device comprising the steps of:
    forming a semiconductor layer over an insulating surface;
    forming a first insulating film over the semiconductor layer;
    forming a first wiring comprising at least a laminate of a first conductive film with a property as a barrier and a second conductive film containing copper as its main component, said step of forming a first wiring including the steps of:
       (i) forming the first conductive film over the first insulating film;
       (ii) etching the first conductive film;
       (iii) forming the second conductive film on the first conductive film through an opening of a mask;
       (iv) reducing a width of the second conductive film with dry etching;
    doping an impurity element into the semiconductor layer with the first wiring as a mask to form an impurity region;
    forming a second insulating film over the first wiring;
    forming a third insulating film over the second insulating film;

forming a fourth insulating film over the third insulating film;

forming a contact hole to reach the impurity region in the second insulating film and the third insulating film and the fourth insulating film; and forming a second wiring electrically connected to the impurity region over the fourth insulating film.

11. A method of manufacturing a semiconductor device according to claim 10 further comprising the steps of:
forming a third conductive film with a property as a barrier over the fourth insulating film;
etching the third conductive film;
forming a fourth conductive film containing copper as its main component on the third conductive film through an opening of a mask; and
reducing a width of the fourth conductive film with dry etching to form the second wiring.

12. A method of manufacturing a semiconductor device comprising the steps of:
forming a semiconductor layer over an insulating surface;
forming a first insulating film over the semiconductor layer;
forming a first wiring comprising at least a laminate of a first conductive film with a property as a barrier and a second conductive film containing copper as its main component, said step of forming a first wiring including the steps of:
 (i) forming the first conductive film over the first insulating film;
 (ii) etching the first conductive film;
 (iii) forming the second conductive film on the first conductive film through an opening of a mask;
 (iv) reducing a width of the second conductive film with dry etching;
doping an impurity element into the semiconductor layer with the first wiring as a mask to form an impurity region;
forming a second insulating film over the first wiring;
forming a contact hole to reach the impurity region in the second insulating film; and
forming a second wiring electrically connected to the impurity region over the second insulating film,
wherein the first conductive film has a tapered shape.

13. A method of manufacturing a semiconductor device according to claim 12 further comprising the steps of:
forming a third conductive film with a property as a barrier over the second insulating film;
etching the third conductive film;
forming a fourth conductive film containing copper as its main component on the third conductive film through an opening of a mask; and
reducing a width of the fourth conductive film with dry etching to form the second wiring.

14. A method of manufacturing a semiconductor device comprising the steps of:
forming a semiconductor layer over an insulating surface;
forming a first insulating film over the semiconductor layer;
forming a first wiring comprising at least a laminate of a first conductive film with a property as a barrier and a second conductive film containing copper as its main component, said step of forming a first wiring including the steps of:
 (i) forming the first conductive film over the first insulating film;
 (ii) etching the first conductive film;
 (iii) forming the second conductive film on the first conductive film through an opening of a mask;
 (iv) reducing a width of the second conductive film with dry etching;
doping an impurity element into the semiconductor layer with the first wiring as a mask to form an impurity region;
forming a second insulating film over the first wiring;
forming a contact hole to reach the impurity region in the second insulating film; and
forming a second wiring electrically connected to the impurity region over the second insulating film,
wherein the second conductive film has a tapered shape.

15. A method of manufacturing a semiconductor device according to claim 14 further comprising the steps of:
forming a third conductive film with a property as a barrier over the second insulating film;
etching the third conductive film;
forming a fourth conductive film containing copper as its main component on the third conductive film through an opening of a mask; and
reducing a width of the fourth conductive film with dry etching to form the second wiring.

16. A method of manufacturing a semiconductor device comprising the steps of:
forming a semiconductor layer over an insulating surface;
forming a first insulating film over the semiconductor layer;
forming a first wiring comprising at least a laminate of a first conductive film with a property as a barrier and a second conductive film containing copper as its main component, said step of forming a first wiring including the steps of:
 (i) forming the first conductive film over the first insulating film;
 (ii) etching the first conductive film;
 (iii) forming the second conductive film on the first conductive film through an opening of a mask;
 (iv) reducing a width of the second conductive film with dry etching;
doping an impurity element into the semiconductor layer with the first wiring as a mask to form an impurity region;
forming a second insulating film over the first wiring;
forming a contact hole to reach the impurity region in the second insulating film; and
forming a second wiring electrically connected to the impurity region over the second insulating film,
wherein the first conductive film has a tapered shape, and
wherein the second conductive film has a tapered shape.

17. A method of manufacturing a semiconductor device according to claim 16 further comprising the steps of:
forming a third conductive film with a property as a barrier over the second insulating film;
etching the third conductive film;
forming a fourth conductive film containing copper as its main component on the third conductive film through an opening of a mask; and
reducing a width of the fourth conductive film with dry etching to form the second wiring.

18. A method according to claim 8, wherein the first conductive film comprises TiN as its main component.

19. A method according to claim 10, wherein the first conductive film comprises TiN as its main component.

20. A method according to claim 12, wherein the first conductive film comprises TiN as its main component.

21. A method according to claim 14, wherein the first conductive film comprises TiN as its main component.

22. A method according to claim 16, wherein the first conductive film comprises TiN as its main component.

23. A method according to claim 8, wherein the first conductive film comprises a laminate of a film containing Ti as its main component and a film comprising one of TiN, TaN, WN, TiC, TaC, and silicon.

24. A method according to claim 10, wherein the first conductive film comprises a laminate of a film containing Ti as its main component and a film comprising one of TiN, TaN, WN, TiC, TaC, and silicon.

25. A method according to claim 12, wherein the first conductive film comprises a laminate of a film containing Ti as its main component and a film comprising one of TiN, TaN, WN, TiC, TaC, and silicon.

26. A method according to claim 14, wherein the first conductive film comprises a laminate of a film containing Ti as its main component and a film comprising one of TiN, TaN, WN, TiC, TaC, and silicon.

27. A method according to claim 16, wherein the first conductive film comprises a laminate of a film containing Ti as its main component and a film comprising one of TiN, TaN, WN, TiC, TaC, and silicon.

28. A method according to claim 8, wherein the first conductive film comprises a laminate of a film containing Ti as its main component and a film comprising one of TiN, TaN, WN, TiC, TaC, and silicon formed on the film containing Ti as its main component.

29. A method according to claim 10, wherein the first conductive film comprises a laminate of a film containing Ti as its main component and a film comprising one of TiN, TaN, WN, TiC, TaC, and silicon formed on the film containing Ti as its main component.

30. A method according to claim 12, wherein the first conductive film comprises a laminate of a film containing Ti as its main component and a film comprising one of TiN, TaN, WN, TiC, TaC, and silicon formed on the film containing Ti as its main component.

31. A method according to claim 14, wherein the first conductive film comprises a laminate of a film containing Ti as its main component and a film comprising one of TiN, TaN, WN, TIC, TaC, and silicon formed on the film containing Ti as its main component.

32. A method according to claim 16, wherein the first conductive film comprises a laminate of a film containing Ti as its main component and a film comprising one of TiN, TaN, WN, TIC, TaC, and silicon formed on the film containing Ti as its main component.

33. A method of manufacturing a semiconductor device according to claim 8, wherein an insulating film with a property as a barrier comprising at least one of silicon nitride, silicon oxynitride, aluminum nitride, and aluminum oxynitride is formed with sputtering to cover the second conductive film.

34. A method of manufacturing a semiconductor device according to claim 9, wherein an insulating film with a property as a barrier comprising at least one of silicon nitride, silicon oxynitride, aluminum nitride, and aluminum oxynitride is formed with sputtering to cover the fourth conductive film.

35. A method of manufacturing a semiconductor device according to claim 12, wherein an insulating film with a property as a barrier comprising at least one of silicon nitride, silicon oxynitride, aluminum nitride, and aluminum oxynitride is formed with sputtering to cover the second conductive film.

36. A method of manufacturing a semiconductor device according to claim 13, wherein an insulating film with a property as a barrier comprising at least one of silicon nitride, silicon oxynitride, aluminum nitride, and aluminum oxynitride is formed with sputtering to cover the fourth conductive film.

37. A method of manufacturing a semiconductor device according to claim 14, wherein an insulating film with a property as a barrier comprising at least one of silicon nitride, silicon oxynitride, aluminum nitride, and aluminum oxynitride is formed with sputtering to cover the second conductive film.

38. A method of manufacturing a semiconductor device according to claim 15, wherein an insulating film with a property as a barrier comprising at least one of silicon nitride, silicon oxynitride, aluminum nitride, and aluminum oxynitride is formed with sputtering to cover the fourth conductive film.

39. A method of manufacturing a semiconductor device according to claim 16, wherein an insulating film with a property as a barrier comprising at least one of silicon nitride, silicon oxynitride, aluminum nitride, and aluminum oxynitride is formed with sputtering to cover the second conductive film.

40. A method of manufacturing a semiconductor device according to claim 17, wherein an insulating film with a property as a barrier comprising at least one of silicon nitride, silicon oxynitride, aluminum nitride, and aluminum oxynitride is formed with sputtering to cover the fourth conductive film.

* * * * *